United States Patent [19]
Mittal

[11] Patent Number: 4,750,086
[45] Date of Patent: Jun. 7, 1988

[54] APPARATUS FOR COOLING INTEGRATED CIRCUIT CHIPS WITH FORCED COOLANT JET

[75] Inventor: Faquir C. Mittal, Audubon, Pa.

[73] Assignee: Unisys Corporation, Detroit, Mich.

[21] Appl. No.: 807,713

[22] Filed: Dec. 11, 1985

[51] Int. Cl.[4] .............................................. H05K 7/20
[52] U.S. Cl. .................................. 361/382; 361/385; 357/82
[58] Field of Search ................ 165/80.4, 908; 357/82; 361/382, 383, 385–388; 174/15 R, 16 HS

[56] References Cited

U.S. PATENT DOCUMENTS

| | | | |
|---|---|---|---|
| 3,649,738 | 3/1972 | Anderson et al. | 357/82 X |
| 3,794,886 | 2/1974 | Goldman | 361/382 |
| 4,138,692 | 2/1979 | Meeker et al. | 357/82 |
| 4,145,708 | 3/1979 | Ferro et al. | 357/82 |
| 4,449,580 | 5/1984 | Reisman et al. | 357/82 X |
| 4,561,040 | 12/1985 | Eastman et al. | 361/385 |
| 4,619,316 | 10/1986 | Nakayama et al. | 361/385 X |

OTHER PUBLICATIONS

Pascuzzo et al, "Integrated Circuit Module Package Cooling Structure", IBM TDB, vol. 20, No. 10, Mar. 1978.

Primary Examiner—G. P. Tolin
Assistant Examiner—A. Jonathan Wysocki
Attorney, Agent, or Firm—Charles J. Fassbender; James R. Bell; L. Joseph Marhoefer

[57] ABSTRACT

The capability of the microbellows cooling technique to remove heat from multi-chip modules is enhanced with a highly conductive, rigid, heat spreader. The heat spreader has a planar surface urged against a planar surface of the chip by the flexible microbellows. The surface area of the heat spreader is greater than the mating surface area of the chip. The heat spreader is attached to the bottom surface of the microbellows. The surface area of the heat spreader which mates with the surface of the chip is highly polished and coated with a highly conductive soft metal. A jet of coolant is forced into the inner surface of the microbellows.

9 Claims, 1 Drawing Sheet

APPARATUS FOR COOLING INTEGRATED CIRCUIT CHIPS WITH FORCED COOLANT JET

FIELD OF THE INVENTION

This invention relates generally to heat exchange of an electrical article and more particularly to cooling a module containing a plurality of integrated circuit chips.

BACKGROUND DESCRIPTION

The temperature of integrated circuit chips must be kept below specified limits to ensure proper function, reliability and useful life. The trend in integrated circuit technology is to pack more circuits per chip which increases the heat generation per chip. Also, system designers are mounting chips closer together to minimize propagation delays in the interconnections. These trends and designs have increased heat flux, i.e. power per unit area and caused a need for improved cooling techniques.

In the cooling of heat producing elements, a conductive heat transfer medium (a solid) is placed into contact with a heat producing element. The medium either has, or contacts another element with has, a greater surface area relative to the heat producing element so that heat is more easily dissipated from the greater surface area. To enhance heat dissipation from surface areas, a fluid is often used as a heat transfer medium by being moved over the heat dissipating surface area to "carry away" heat by convection. From the foregoing it becomes quite clear that heat transfer is enhanced when there is greater surface contact between a heat producing element and a heat transfer medium.

The development of multichip thermal conduction modules to enhance the cooling of concentrations of chips resulted in various conduction cooling techniques including a plurality of resiliently urged pistons each contacting a chip and providing a thermal path to a portion of the module housing which is convection cooled by a fluid coolant.

This technique was further enhanced by encapsulating the pistons in Helium gas to promote conduction cooling. Also, coolants such as air, water and fluorocarbons have been pumped through the housings.

One limitation of fluorocarbons used in immersion cooling is that they chemically break down after prolonged use. Another limitation is that if the fluorocarbon coolant has been permitted to contact the chips, contamination can occur.

Such pistons limit heat transfer regardless of piston geometry due to the rigidity of the piston. For example, if the piston has a curved contact surface then limited point contact with the relatively planar chip surface results in reduced heat transfer. Where the piston also has a relatively planar contact surface, the piston and chip contact surfaces must be in substantial alignment to avoid point contact.

Another approach, as an alternative to the resiliently urged pistons, was to use a flexible microbellows as a conductive heat transfer medium to increase contact surface area between the conductive heat transfer medium and the chip.

In the basic microbellows cooling technique, a flat contacting surface of the microbellows, usually about 0.0015 inches thick of Nickle, contacts a flat surface of the chip. By design, the microbellows are flexible in axial and angular directions. However, the contacting surface of the microbellows requires high pressures for conforming to the chip surface when the contacting surface area of the microbellows are smaller or equal to the chip surface area. If the surface area of the microbellows is larger than the chip surface area, which is more desirable, the microbellows may make contact at the four corners of the chip surface area. This imposes high heat resistance to heat flow.

The foregoing illustrates limitations known to exist in present devices. Thus, it is apparent that it would be advantageous to provide an alternative directed to overcoming one or more of the limitations set forth above. Accordingly, a suitable alternative is provided including features more fully disclosed hereinafter.

SUMMARY OF THE INVENTION

In one aspect of the present invention, this is accomplished by providing an apparatus for cooling integrated circuit chips comprising a housing defining a chamber and including a board having chips mounted so as to extend into the chamber. Each chip has a planar surface defining a first surface area. A plurality of flexible elements are each provided with a planar heat receiving end for conducting heat away from the chips. The heat receiving end of each flexible element is adjacent a respective one of the chips. A rigid heat speaker has a planar surface connected to the heat receiving end of the flexible element. The heat spreader also has another planar surface defining a second surface area greater than the first surface area of the chip. The second surface area of each heat spreader is urged into planar contact with the first surface area of each chip in response to flexibility in the flexible element. A fluid coolant is conducted into each flexible element adjacent the heat receiving end.

The foregoing and other aspects will become apparent from the following detailed description of the invention when considered in conjunction with the accompanying drawing. It is to be expressly understood, however, that the drawing is not intended as a definition of the invention but is for the purpose of illustration only.

DESCRIPTION OF THE PREFERRED EMBODIMENT

Figure 1:
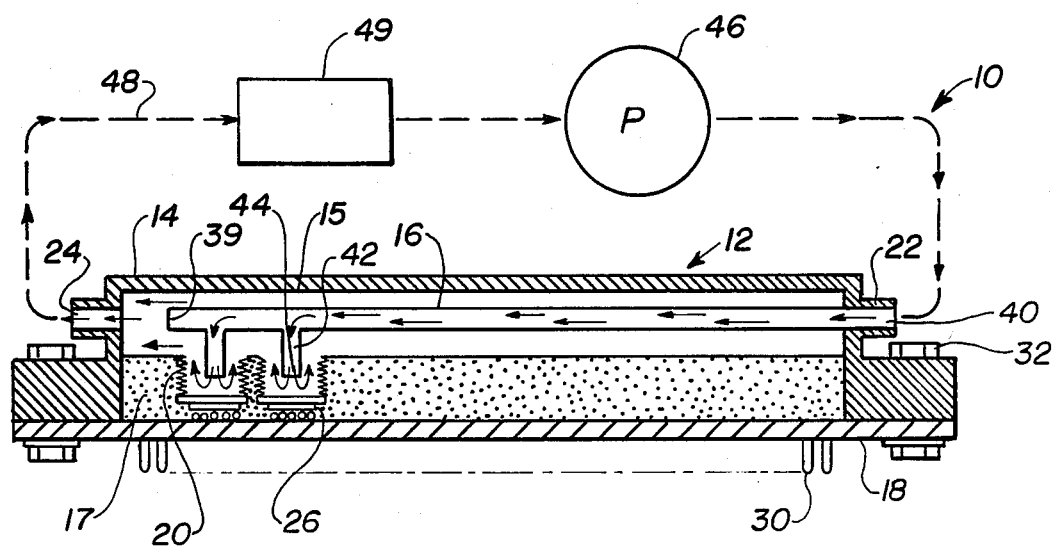
FIG. 1 is a graphical view illustrating an embodiment of the cooling apparatus of this invention.

An apparatus for cooling integrated circuit (I.C.) chips is illustrated in the embodiment of FIG. 1 as an improved thermal conduction module generally designated 10. Module 10 includes a housing assembly 12 having a cap 14, a pair of fluid conduits 15, 16 a printed circuit (P.C.) board 18, and flexible means 20. A Helium filled chamber 17 is formed in housing 12.

Figure 2:
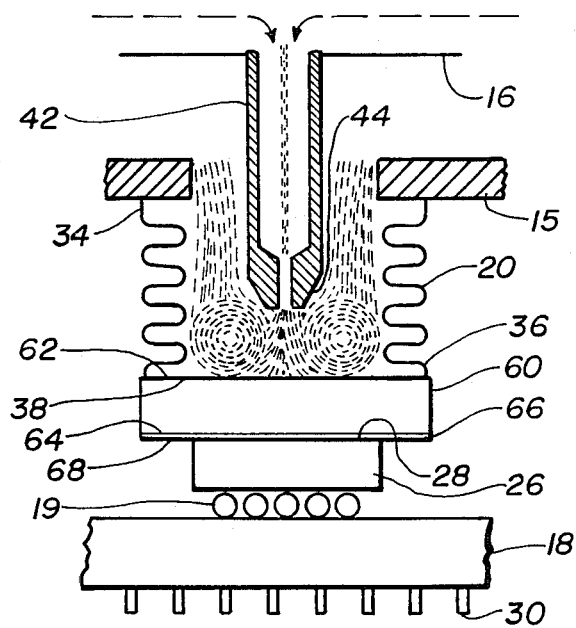
FIG. 2 is an exploded view illustrating an embodiment of the heat removing elements of this invention.

Generally, modules 10 are known and cap 14 is preferably of Stainless Steel, Brass or Beryllium Copper and includes a fluid inlet 22 and a fluid outlet 24. Board 18, see also FIG. 2, includes a plurality of integrated circuit chips 26 mounted thereon, preferably by solder at 19, having a substantially planar surface 28 extending into chamber 17. Surface 28 defines a first surface area. A plurality of connector pins 30 are also mounted on board 18. Cap 14 and board 18 are commonly held together by a plurality of suitable bolts 32.

A first means, such as Brass (or other suitable material) conduit 15, is provided to extend through chamber 17 in fluid communication with outlet 24 for conducting a fluid coolant through chamber 17. Flexible means such as a microbellows 20, formed of a suitable material such as Beryllium Copper or Nickel, each have a first end 34 connected to fluid communication with conduit 15 and a second closed end 36 including a substantially planar heat receiving surface 38.

A second means, such as Brass (or other suitable material) conduit 16, is provided to extend substantially, but not necessarily, concentrically into conduit 15 for conducting the fluid coolant therethrough. Conduit 16 has a closed end 39 and an open end 40 in fluid communication with inlet 22. A portion 42 is in fluid communication with main conduit 15 and has an open end 44 extending substantially, but not necessarily concentrically into each microbellows 20 for fluid communication therewith.

A pump 46 and appropriate conduit 48 may be appropriately connected to inlet 22 and outlet 24 for moving a fluid coolant into smaller diameter conduit 16 thus accelerating flow of the coolant in microbellows 20 adjacent chip 26. The fluid coolant then flows into realtively larger diameter conduit 15 and exits via outlet 24. A heat exchanger 49, or some suitable means for recooling the fluid, is provided.

A rigid heat spreader member 60 is preferably formed of a heat conductive, electrically insulative material such as Beryllia and is from about 0.025 inches to about 0.035 inches in thickness. Heat spreader 60 has a planar surface 62 preferably soldered by a lead-tin eutectic solder to planar surface 38 of microbellows 20. Instead of solder, a thermally conductive, electrically insulative epoxy can be used. Another planar surface 64 of heat spreader 60 is polished to about a 1-2 micro-inch finish and then coated with about a 10 micro-inch coating 66 of Gold. A coating of a material other than Gold may be used but should be a material having relatively high thermal conductivity and relatively low hardness compared to the hardness of the spreader material. The Gold is coated on surface 64 by any acceptable plating method. Gold coated surface 68 of spreader 60 defines a second surface area which is urged into contact with surface 28 of chip 26 due to inherent resilience of flexible microbellows 20. It is important that the surface area defined by coated surface 68 be greater than the surface area defined by chip surface 28 to extend the surface 28 of chip 26 and provide better temperature distribution. Also, due to the inherent flexibility of microbellows 20, surface 68 will comply or conform into abutting engagement with surface 28 of chip 26 in response to being urged into surface-to-surface contact with a respective chip. Such surface-to-surface contact, as opposed to point contact, reduces contact resistance between chip 26 and spreader 60 and thus improves the rate of heat transfer therebetween.

In operation, heat is conducted from chips 26 to microbellows 20 via heat spreader 60 having an increased surface area 68 compared to a mating surface area 28 of chip 26. Thermal conduction in chamber 17 is enhanced by the presence of Helium. Fluid moved through conduits 15, 16 and microbellows 20 by a pump 46 provides convection cooling to dissipate heat transferred to microbellows 20.

It is anticipated that microbellows 20 can be mounted in housing 12 other than being connected to first conduit 15. In such an arrangement, second conduit 16 would introduce coolant into each microbellows and a suitable exit in housing 12 would provide for removal of the coolant.

The foregoing had described an efficient means of heat removal from high powered multi-chip configurations. A highly conductive heat spreader is joined to a very thin metallic microbellows. The heat spreader contacts the I.C. chip surface and a jet of coolant impinges on the inside surface of the microbellows to remove heat.

Structurally, the heat spreader is a rigid member compared to the microbellows. The heat spreader has a highly polished surface which is Gold plated. This surface defines an area greater than the mating area of the chip which, in effect, extends the surface area of the chip and distributes the temperature better.

Using the above described apparatus, thermal resistance due to forced, submerged water jet convection was about 2 degrees C./watt/chip (0.300 inch square) at a cold water flow rate of about 60 CC/min/chip at a 3.00 psi pressure drop. The total thermal resistance from the junction of the chip to cold water was about 3.5 degrees C./watt/chip. In another test point, for a cold water flow rate of 115 CC/min/chip at a 3.00 psi pressure drop (larger jet size), the total thermal resistance achieved was about 2 degrees C./watt/chip. Lower contact thermal resistance is expected with helium at the interface of the heat spreader and the mating chip surfaces. Test results also show that the thermal contact resistance is much lower for unpolished contacting surfaces of the heat spreader and the chip as compared to the thermal contact resistance obtained with direct contact of the bellows surface to the chip surface.

With the heat spreader, the chip surface contact is better at very low back pressures of the coolant. This improves heat transfer because of lower thermal resistance between the chip and the microbellows jet impingement surface. Low back pressures in the microbellows impose low compressive stresses on the chips and interconnects. Thus, fatigue and creep life are improved. To ensure good surface-to-surface contact for improved heat removal, it is easier to control the rigid heat spreader surface properties than the flexible microbellows surface. For example, the heat spreader surface can be highly polished and coated with a highly conductive soft metal coating to further enhance thermal contact conductance.

What is claimed is:

1. An apparatus which cools integrated circuit chips comprising:
   a housing including a chamber therein and a board having said chips mounted thereon, each chip extending into said chamber and having a substantially planar surface defining a first surface area;
   a plurality of flexible heat conducting microbellows supported in said housing and each having a planar heat receiving end adjacent a respective one of said chips;
   a plurality of rigid heat spreaders which each have a planar surface connected to said heat receiving end of a respective microbellows, each heat spreader having another planar surface defining a second polished and metal coated surface area greater than said first surface area of a respective chip, said second surface area of each heat spreader being in planar contact with said first surface area of a respective chip;

means for conducting a fluid coolant into each microbellows, said conducting means being supported in said chamber and having respective open ends extending into each microbellows such that they are spaced apart and detached from the heat receiving end; and, each open end being shaped as a nozzle which discharges a high velocity jet of said fluid coolant directly onto the corresponding microbellows heat receiving end to cool the corresponding heat spreader and compress it against a chip.

2. The apparatus of claim 1 wherein each heat spreader is formed of a heat conductive, electrically insulative metal.

3. The apparatus of claim 1 wherein each heat spreader has a thickness of from about 0.025 inches to about 0.035 inches.

4. The apparatus of claim 1 wherein each heat spreader is connected to said microbellows by a solder.

5. The apparatus of claim 1 wherein each heat spreader is connected to said microbellows by a heat conductive, thermally insulative adhesive.

6. The apparatus of claim 1 wherein each second surface area is coated with a heat conductive, electrically insulative metal different from the metal of each heat spreader.

7. The apparatus of claim 1 including:

means for moving said fluid coolant into each microbellows, said moving means including a pump and a heat exchanger.

8. The apparatus of claim 1 wherein said chamber includes an inert fluid therein.

9. An apparatus which cools an integrated circuit chip comprising:

a conduit means for carrying a fluid coolant along a predetermined path to and from said chip;

said conduit means including a flexible member which forms a portion of said path for said coolant;

said flexible member having a heat receiving end with a heat spreader attached thereto, and said heat spreader having a surface in contact with said chip;

a nozzle inside of said flexible member and in close proximity to said heat receiving end but detached therefrom;

said nozzle being shaped to discharge a jet of said fluid coolant against said heat receiving end of said flexible member which in turn cools said heat spreader and compresses it against said chip.

* * * * *